US006864186B1

(12) United States Patent
Yates

(10) Patent No.: US 6,864,186 B1
(45) Date of Patent: Mar. 8, 2005

(54) METHOD OF REDUCING SURFACE CONTAMINATION IN SEMICONDUCTOR WET-PROCESSING VESSELS

(75) Inventor: Donald L. Yates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/123,430

(22) Filed: Jul. 28, 1998

(51) Int. Cl.$^7$ .......................... H01L 21/302; B08B 6/00
(52) U.S. Cl. ...................... 438/745; 438/747; 134/1.2; 134/1.3
(58) Field of Search ................. 438/745–747; 134/1.2, 1.3, 184, 186, 105, 102.1, 34, 193, 239

(56) References Cited

U.S. PATENT DOCUMENTS

| | | | | |
|---|---|---|---|---|
| 3,869,313 A | * | 3/1975 | Jones et al. ................. 134/73 |
| 3,953,265 A | * | 4/1976 | Hood ........................... 156/8 |
| 4,129,457 A | | 12/1978 | Basi |
| 4,388,140 A | | 6/1983 | Nakazato et al. |
| 4,544,446 A | | 10/1985 | Cady |
| 4,557,785 A | | 12/1985 | Ohkuma |
| 4,576,618 A | * | 3/1986 | Wooldridge et al. ........ 55/122 |
| 4,920,069 A | | 4/1990 | Fossum et al. |
| 5,000,207 A | * | 3/1991 | Titterington et al. ........ 134/44 |
| 5,019,205 A | | 5/1991 | Endl et al. |
| 5,089,084 A | | 2/1992 | Chhabra et al. |
| 5,253,663 A | | 10/1993 | Tanaka et al. |
| 5,275,184 A | * | 1/1994 | Nishizawa et al. ....... 134/57 R |
| 5,437,765 A | | 8/1995 | Loewenstein |
| 5,464,480 A | | 11/1995 | Matthews |
| 5,474,616 A | * | 12/1995 | Hayami et al. ............... 134/32 |
| 5,579,792 A | * | 12/1996 | Stanasolovich et al. ..... 134/184 |
| 5,626,677 A | | 5/1997 | Shirahata |
| 5,635,022 A | | 6/1997 | Vaartstra |
| 5,656,097 A | * | 8/1997 | Olesen et al. ................. 134/1 |
| 5,776,296 A | * | 7/1998 | Matthew ..................... 156/345 |
| 5,795,401 A | * | 8/1998 | Itoh et al. ..................... 134/6 |
| 5,820,689 A | * | 10/1998 | Tseng et al. .................. 134/3 |
| 5,839,456 A | * | 11/1998 | Han ......................... 134/104.1 |
| 5,885,360 A | * | 3/1999 | Han et al. ..................... 134/1 |
| 5,913,981 A | | 6/1999 | Florez ........................... 134/3 |
| 5,958,146 A | * | 9/1999 | Mohindra et al. ............. 134/2 |
| 5,985,041 A | | 11/1999 | Florez ........................... 134/2 |
| 5,996,595 A | * | 12/1999 | Olesen et al. ............... 134/1.3 |
| 6,131,588 A | * | 10/2000 | Kamikawa et al. ...... 134/102.3 |

OTHER PUBLICATIONS

Merriam Webster's Colligate Dictionary 10th edition, p. 366 and 568 (1998).*

* cited by examiner

Primary Examiner—George Fourson
Assistant Examiner—Brook Kebede
(74) Attorney, Agent, or Firm—Dickstein Shapiro Morin & Oshinsky LLP

(57) ABSTRACT

A method and apparatus for reducing the contaminants in a wet etching bath by rapidly removing a substantial portion of the etching liquid from the bath such that the contaminants are removed from the air/liquid interface of the bath surface is described. By rapidly removing a substantial portion of the etching liquid from the bath, contaminants that are trapped by eddy currents and liquid/air surface tension forces are greatly reduced at the surface of the bath. The semiconductor wafers treated showed reduced levels of contamination.

8 Claims, 8 Drawing Sheets

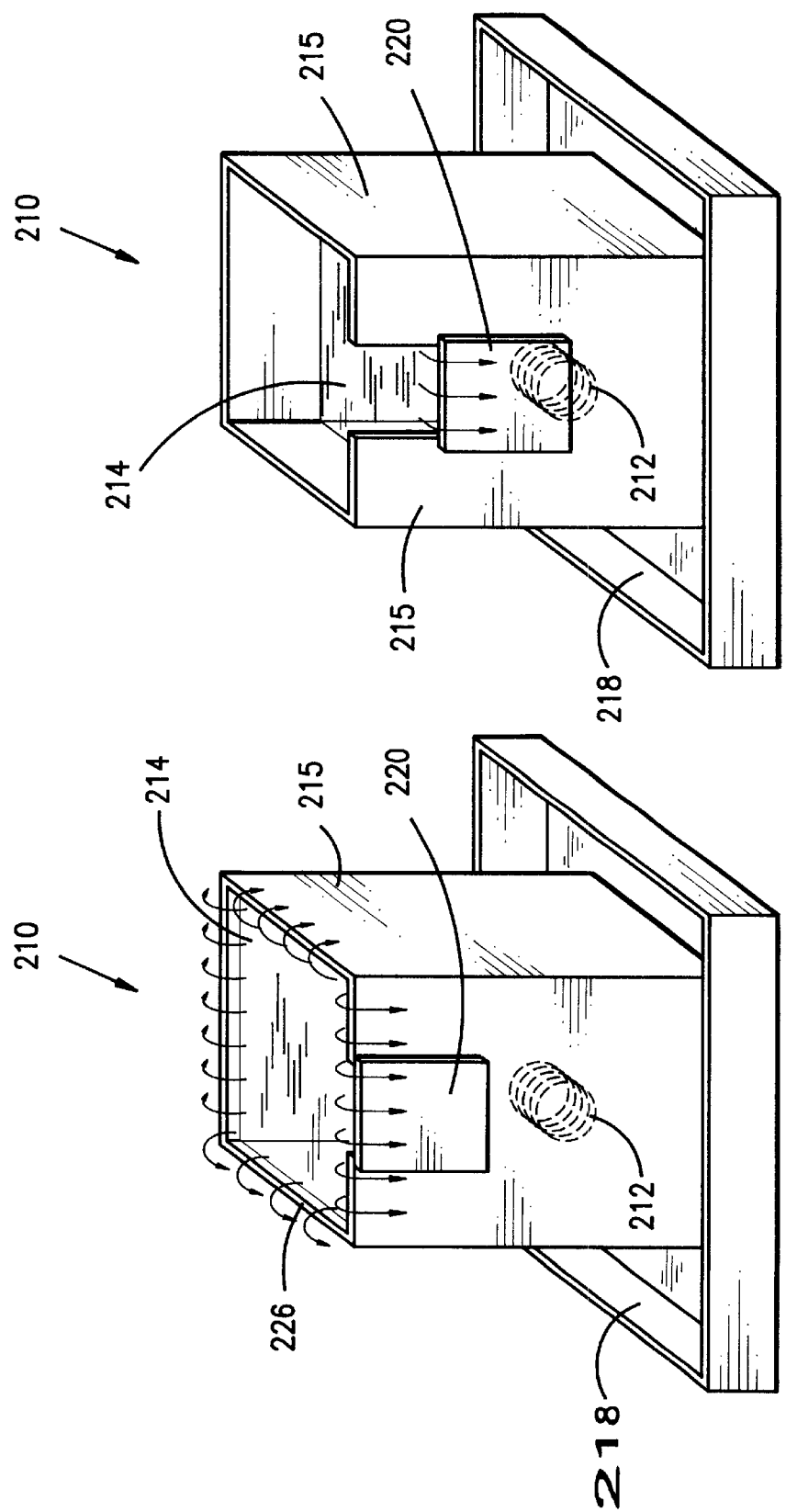

METHOD OF REDUCING SURFACE CONTAMINATION IN SEMICONDUCTOR WET-PROCESSING VESSELS

FIELD OF THE INVENTION

The invention relates generally to a method for reducing the contaminants in a wet etching bath and more particularly to a method for rapidly removing a substantial portion of the etching liquid from the bath such that any contaminants are removed from the air/liquid interface of the bath surface.

BACKGROUND OF THE INVENTION

In the fabrication of semiconductor wafers several process steps require contacting the wafers with fluids. Examples of such process steps include etching, photoresist stripping, and prediffusion cleaning. The chemicals utilized in these steps often comprises strong acids, alkalis, or solvents. The equipment conventionally used for contacting semiconductor wafers with process fluid consists of a series of tanks or sinks into which boats of semiconductor wafers are dipped.

Removing the wafers from the tank often results in contamination, which is detrimental to the microscopic circuits which the fabrication process creates. Since the chemicals generally are manufactured by chemical companies and shipped to the semiconductor manufacturing plant, the initial chemical purity is limited by the quality of the water used by the chemical manufacturers, the container used for shipping and storing the chemical and the handling of the chemical. Additionally, the etching bath is contaminated from the build-up of impurities both dissolved and undissolved in the process bath during the processing of the semiconductor wafers. Moreover, as chemicals age, they can become contaminated with impurities from the air and from the wafers.

Thus, the etching solution must be changed periodically. The treatment of the last batch of wafers prior to fluid rejuvenation may not be as effective as treatment of the first batch of wafers in a new solution. Non-uniform treatment is a major concern in semiconductor manufacturing.

In semiconductor processing involving wet etching and cleaning, bath contamination at the air/liquid interface of the bath surface cannot be completely removed by air or liquid filtration. Therefore, when semiconductor wafers are removed from a wet etching/cleaning bath, the wafers become contaminated by the contaminants present at the air/liquid interface of the bath.

The present invention overcomes the drawbacks of the prior etching/cleaning methods by reducing the surface contaminants in a wet etching bath. The present invention provides a method for rapidly removing a substantial portion of the etching liquid from the bath such that the contaminants are removed from the air/liquid interface of the bath.

SUMMARY OF THE INVENTION

The present invention provides a method for rapidly removing a substantial portion of the etching liquid from the bath such that the contaminants are removed from the air/liquid interface of the bath surface before the wafers are removed from the bath. Rapid removal of a substantial portion of the etching liquid from the bath, reduces the amount of contaminants that are trapped by eddy currents and liquid/air surface tension forces at the surface of the bath. By rapidly removing these contaminants from the surface of the bath, the semiconductor wafers can be removed from the etching bath with reduced levels of contamination on the surfaces of the wafers.

The above and other advantages and features of the invention will be more clearly understood from the following detailed description which is provided in connection with the accompanying drawings.

BRIEF DESCRIPTION OF DRAWING

FIG. 9 is a perspective view of an etching bath apparatus of a third embodiment of the present invention.

FIG. 10 is a perspective view of an etching bath apparatus of a third embodiment of the present invention showing the rapid removal of the etching solution.

DETAILED DESCRIPTION OF THE PREFERRED EMBODIMENTS

In semiconductor processing, various aqueous and non-aqueous solutions are employed for etching and cleaning semiconductor wafers. In many instances, much of the contamination seen in post process inspections has adsorbed to the semiconductor wafer surface while the wafer was being extracted from the wet process vessel.

For example, in the instance of HF chemistries, hydrophobic contamination becomes trapped at the bath surface, gathering in eddy currents. These contaminants then deposit on the hydrophobic surfaces of the wafers as they are extracted through the air/liquid interface of the processing bath.

Crescent shaped defect patterns are commonly seen at the edge of wafers inspected after wet cleans and are a typical indication of surface contamination. Contamination suspended in the process bath will typically take on a more random distribution than solution or air borne contamination. However, these surface contaminants may be removed if a sufficient volume of the process solution can be rapidly removed from the top of the process vessel before a wafer is removed from the process bath. By rapidly removing a sufficient volume of the process solution, it is possible to overcome the surface tension and eddy currents between the surface contaminants at the air/liquid mixture of the etching bath and thus remove a large percentage of the surface contaminants present in the etching bath. The term "rapidly removing" used herein refers to removing a portion of the fluid from the process vessel at a flow rate sufficient to remove at least a portion of the surface contaminants on the processing fluid from the process vessel.

Exemplary processes and apparatuses for removing the surface contamination from the air/liquid interface of an etching/cleaning bath according to the present invention are described below. It is to be understood, however, that these processes and apparatuses are a few examples of many possible processes. The invention is not intended to be limited by the particular process described below.

Figure 1:
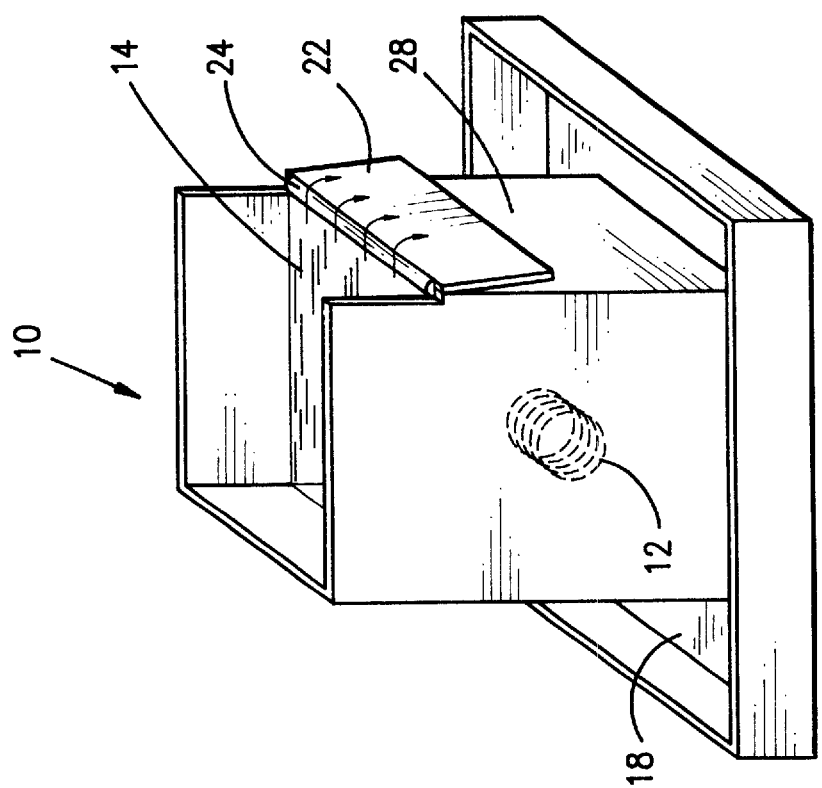
FIG. 1 is a perspective view of an etching bath apparatus of a first embodiment of the present invention.

Referring now to FIG. 1, an etching bath apparatus 10 is shown which includes an etching solution 14. It should be understood that any type of etching solution may be used in accordance with the present invention depending upon the particular substrate or material to be etched from the substrate. Examples of typical etchant solutions are those such as hydrofluoric acid solutions, potassium hydroxide solutions or the like. It should also be understood that a cleaning solution may also be used in accordance with the present invention and that any particular cleaning bath solution may be used depending upon the materials to be cleaned.

The wafers 12 may be added to the etching bath apparatus 10 in order to etch the wafers 12. It should be understood that the one or a plurality of wafers may be used in accordance with the present invention in any type of mechanism, for example, a wafer boat. The wafers 12 remain in the etching solution 14 for a period of time sufficient to effectively etch the wafers 12. During the predetermined period of time that the wafers 12 remain in the etching solution 14, the etching solution 14 is fed to the etching bath apparatus and cascades over the edge 26 of the outer walls 20 of the etching bath apparatus 10 as indicated by the arrows. The etching solution 14 flows down the outer walls 20 and into the outer weir 18, where it is collected. The etching solution 14 may then be purified or cleaned and is then recycled to the etching bath apparatus 10 (not shown).

According to a first embodiment of the present invention, at least one outer wall 20 contains at least one upper wall component 22 (one being shown in the figure). The upper wall component 22 is hingedly connected to a lower wall component 28 of the etching bath apparatus 10 by a hinge 24. The upper wall component 22 may be latched to the adjacent outer walls 20 of the etching bath apparatus 10, as shown in FIG. 1.

It should be understood that any type of component that rapidly removes the etching solution from the etching bath apparatus 10 may work with the present invention. It should also be understood that the rapid removal of the upper portion of the etching solution may be removed from any type of etching apparatus. For example, while the figures show a cascade etching apparatus, the present invention may also be used with a static etching bath. Further, the upper portion of the etching solution may be removed from the etching apparatus during the continuous operation of a cascade flow etching bath, when the etching solution flow to a cascade flow etching bath has been stopped or in a static etching bath. For example, although the figures depict the upper wall component as a square hinged member in a cascade etching bath, it is understood that a round or other shaped hole that can be unplugged to rapidly remove the upper portion of the etching solution from the bath apparatus is also a part of the present invention. Further, it should be understood that in a preferred implementation, the portion of the etching solution that is removed is an amount sufficient to remove surface contaminants from the etching bath but not so much that the wafers in the etching apparatus are exposed.

Figure 2:
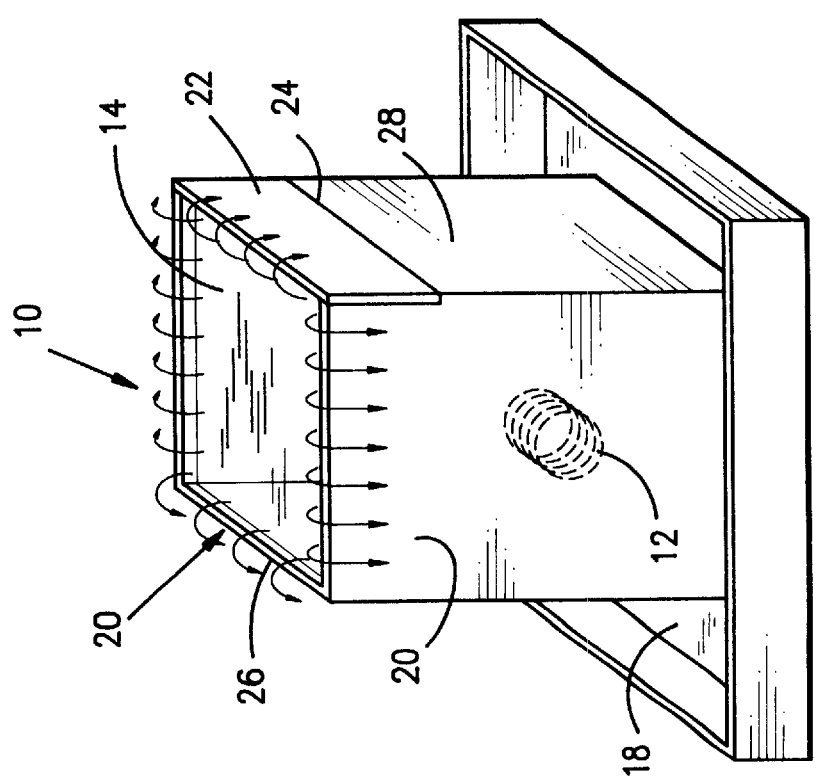
FIG. 2 is a perspective view of an etching bath apparatus of a first embodiment of the present invention showing the rapid removal of the etching solution.

Reference is now made to FIG. 2. After the wafers 12 have been contacted by the etching solution 14 for a sufficient period of time, the upper wall component 22 is released and the upper wall component 22 pivotally rotates about the hinge 24. Once the upper wall component 22 is released, the liquid holding capacity of etching apparatus 10 is reduced, and the etching solution 14 rapidly flows from the etching bath apparatus 10 and into the outer weir 18 as indicated by the arrows.

Figure 4:
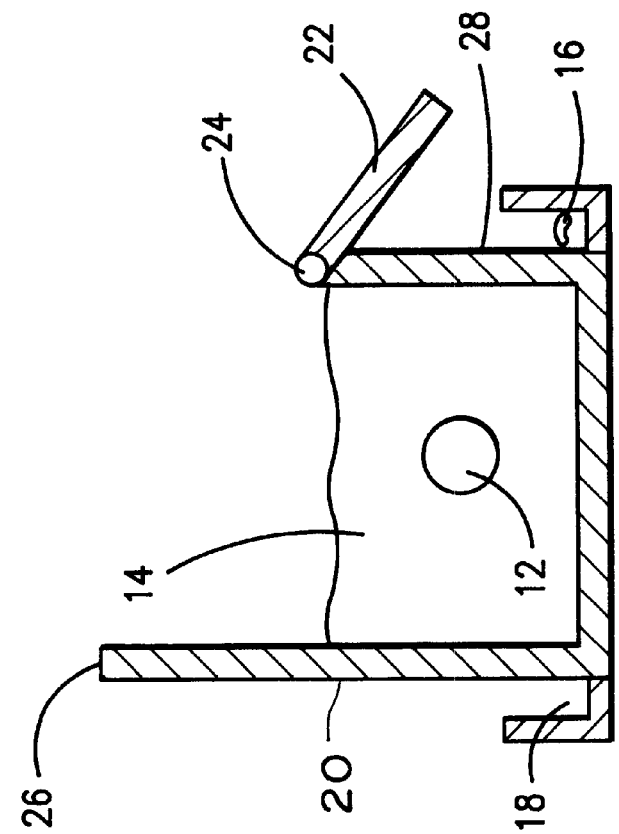
FIG. 4 is a cross-sectional view of an etching bath apparatus of a first embodiment of the present invention showing the rapid removal of the etching solution as shown in FIG. 2.
Figure 3:
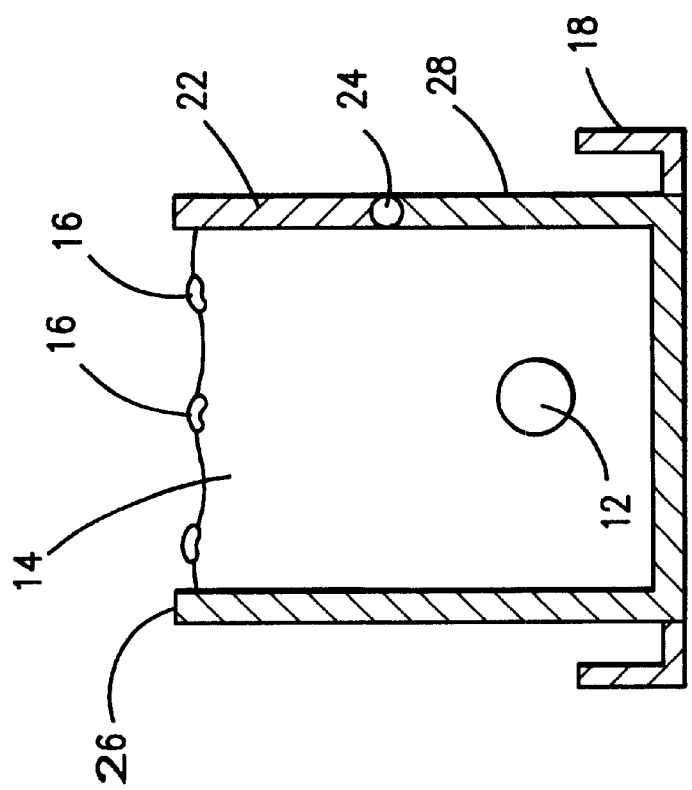
FIG. 3 is a cross-sectional view of an etching bath apparatus of a first embodiment of the present invention shown in FIG. 1.

Reference is now made to FIGS. 3 and 4. FIG. 3 is a cross-sectional view of the etching bath apparatus 10 shown in FIG. 1. As can be seen from this figure, the wafers 12 are submerged in the etching solution 14. As the wafers are etched, surface contaminants 16 form at the air/liquid interface of the etching bath apparatus 10. The contaminants 16 may be any contaminants that are formed as a result of the etching process, such as, for example silicates, polymeric silicates or the like formed from the reaction between the etching solution 14 and the wafers 12. The contaminants may also be formed from impurities in the etching chemicals.

As can be seen from FIG. 4, once the upper wall component 22 is released, the upper portion of the etching solution rapidly flows out of the etching bath apparatus 10. Since the flow rate of the etching solution 14 is significant, due to the sudden release of the upper wall component 22, the surface tension and eddy current forces holding the contaminants 16 at the air/liquid interface are cleaved and the contaminants 16 flow into the outer weir 18 where they may be collected.

When the etching solution is rapidly released, the level of the etching solution 14 should be maintained such that the wafers 12 remain immersed in the etching solution 14. The wafers 12 are then removed from the etching bath apparatus 10. Since the surface contaminants 16 have been removed from the air/liquid interface, the wafers 12 have significantly less contaminants present than if the surface contaminants 16 had not been removed.

Figure 5:
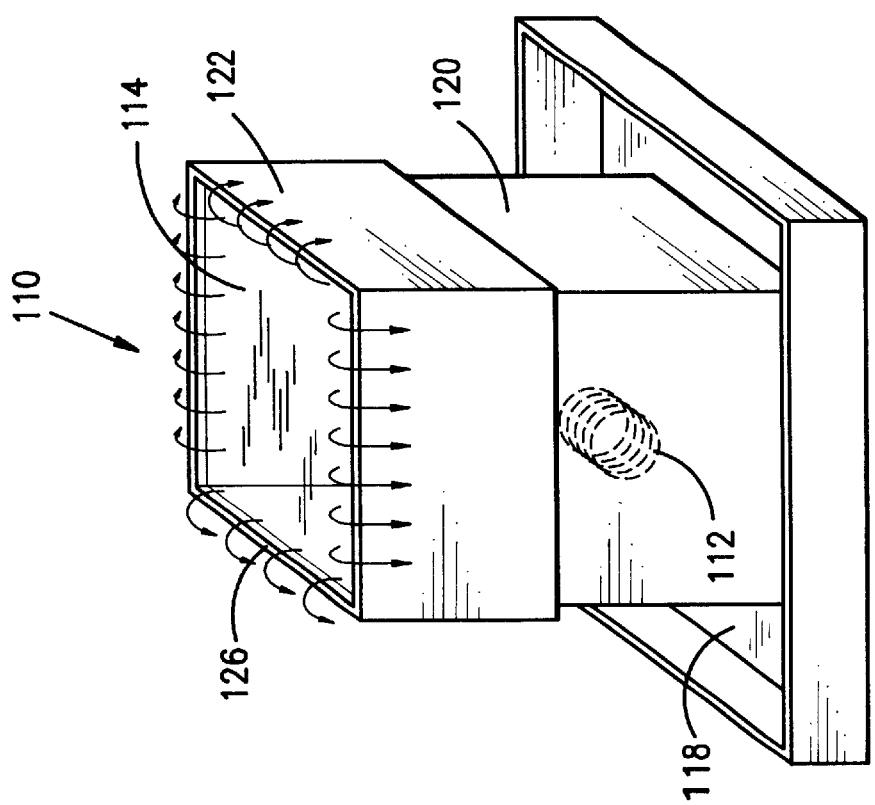
FIG. 5 is a perspective view of an etching bath apparatus of a second embodiment of the present invention.

Reference is now made to FIG. 5. This figure show a second embodiment of the present invention. An etching bath apparatus 110 is shown which includes an etching solution 114. Wafers 112 are added to the etching bath apparatus 110 to etch the wafers 112 in a semiconductor or other process. The wafers 112 remain in the etching solution 114 for a period of time sufficient to effectively etch the wafers 112. During the predetermined period of time that the wafers 112 remain in the etching solution 114, the etching solution 114 may be added to the etching bath apparatus 110 with the overflow etching solution cascading over the edges 126 of the upper wall components 122 of the etching bath apparatus 110 as indicated by the arrows. The etching solution 114 flows down the upper wall components 122 and the lower wall components 120 and into the outer weir 118, where it may be collected.

Figure 8:
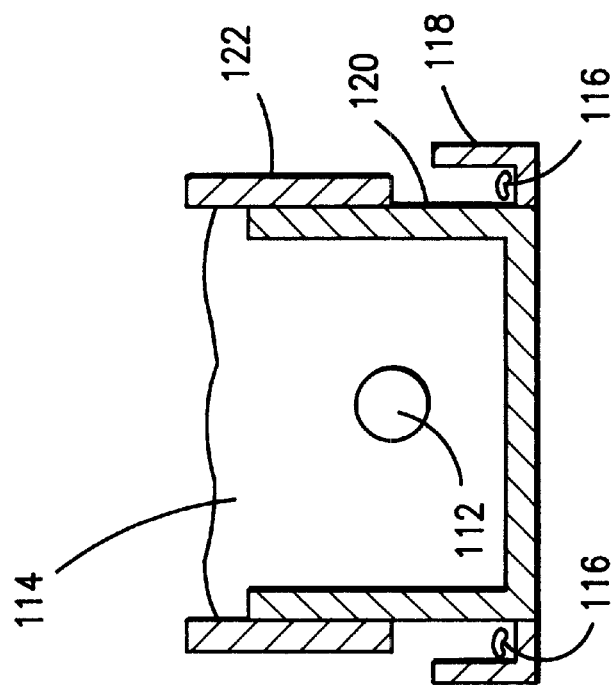
FIG. 8 is a cross-sectional view of an etching bath apparatus of a second embodiment of the present invention showing the rapid removal of the etching solution as shown in FIG. 6.
Figure 7:
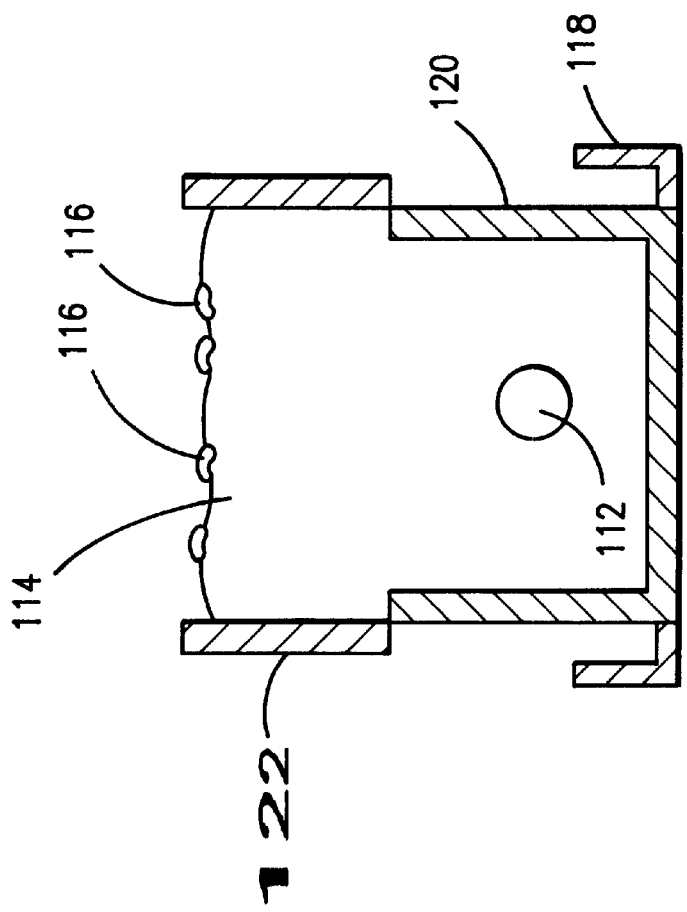
FIG. 7 is a cross-sectional view of an etching bath apparatus of a second embodiment of the present invention shown in FIG. 5.

According to a second embodiment of the present invention, the etching bath apparatus 110 contains an upper wall component 122 and the lower wall component 120. The upper wall component 122 has a slightly greater diameter than the lower wall component 120, as shown in FIGS. 7 and 8. The upper wall component 122 is held above the lower wall component 120 by any conventional apparatus and a seal is formed between the upper wall component 122 and the lower wall component 120 so that the etching solution 114 remains in the etching bath apparatus 110.

While the upper wall component 122 and the lower wall component 120 are shown in the figure as having a square cross section, it should be understood that the apparatus may take any shape, for example, the components can be circular, octagonal, rectangular or the like.

Figure 6:
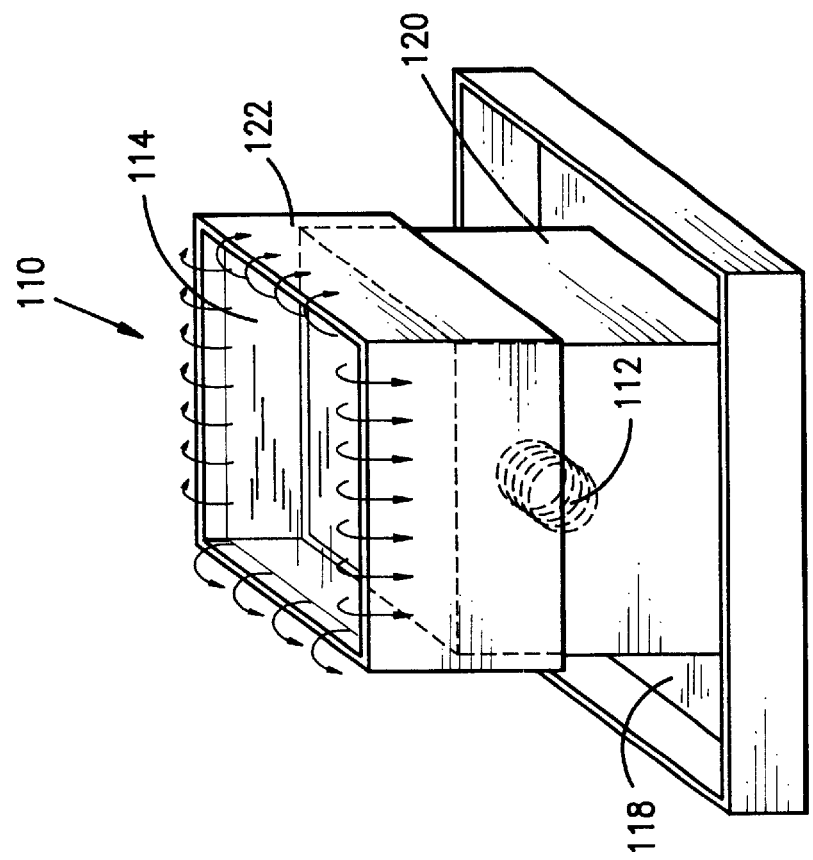
FIG. 6 is a perspective view of an etching bath apparatus of a second embodiment of the present invention showing the rapid removal of the etching solution.

After the wafers 112 have been contacted by the etching solution 114 for a sufficient period of time, the upper wall component 122 is released and the upper wall component 122 quickly slides telescopically down the lower wall component 120 as shown in FIGS. 6 and 8.

FIG. 7 is a cross-sectional view of the etching bath apparatus 110 as shown in FIG. 5. As can be seen from this figure, the wafers 112 are submerged in the etching solution 114. As the wafers are etched, surface contaminants 116 form at the air/liquid interface of the etching bath apparatus 110. As can be seen from FIG. 8, once the upper wall component 122 is released, the liquid holding capacity of etching apparatus 110 is reduced, and the etching solution 114 rapidly flows out of the etching bath apparatus 110. Since the flow rate of the etching solution 114 is significant due to the sudden release of the upper wall component 22, the surface tension and eddy current forces holding the contaminants 116 at the air/liquid interface are broken and the contaminants 116 flow into the outer weir 118 where they may be collected.

When the etching solution is rapidly released, the level of the etching solution 114 should be maintained such that the wafers 112 remain immersed in the etching solution 114. The wafers 112 are then removed from the etching bath apparatus 110.

Referring now to FIG. 9, an etching bath apparatus 210 is shown which includes an etching solution 214. Wafers 212 may be added to the etching bath apparatus 210 for etching. The wafers 212 remain in the etching solution 214 for a period of time sufficient to effectively etch the wafers 212. During the predetermined period of time that the wafers 212 remain in the etching solution 214, the etching solution may be continually refreshed to the etching bath apparatus 210 with the excess etching solution slowly cascading over the edge 226 of the outer walls 215 of the etching bath apparatus 210 as indicated by the arrows. The etching solution 214 flows down the outer wall 215 and into the outer weir 218, where it is collected.

According to a third embodiment of the present invention, at least one outer wall 215 contains at least one slideable door component 220 (one being shown in the figure). The slideable door component 220 slides along the outer wall component 215 of the etching bath apparatus 210.

Reference is made to FIG. 10. After the wafers 212 have been contacted by the etching solution 214 for a sufficient period of time, the slideable door component 220 is released and the slideable door component 220 slides down the outer wall component 215, reducing the liquid holding capacity of etching bath apparatus 210, and rapidly releasing the etching solution 214, which rapidly flows into the outer weir 218 as indicated by the arrows.

Since the flow rate of the etching solution 214 is significant due to the sudden release of the slideable door component 220, the surface tension and eddy current forces holding the contaminants at the air/liquid interface are broken and the contaminants flow into the outer weir 218. Since the surface contaminants have been removed from the air/liquid interface, the wafers 212 have significantly less contaminants.

Figure 11:
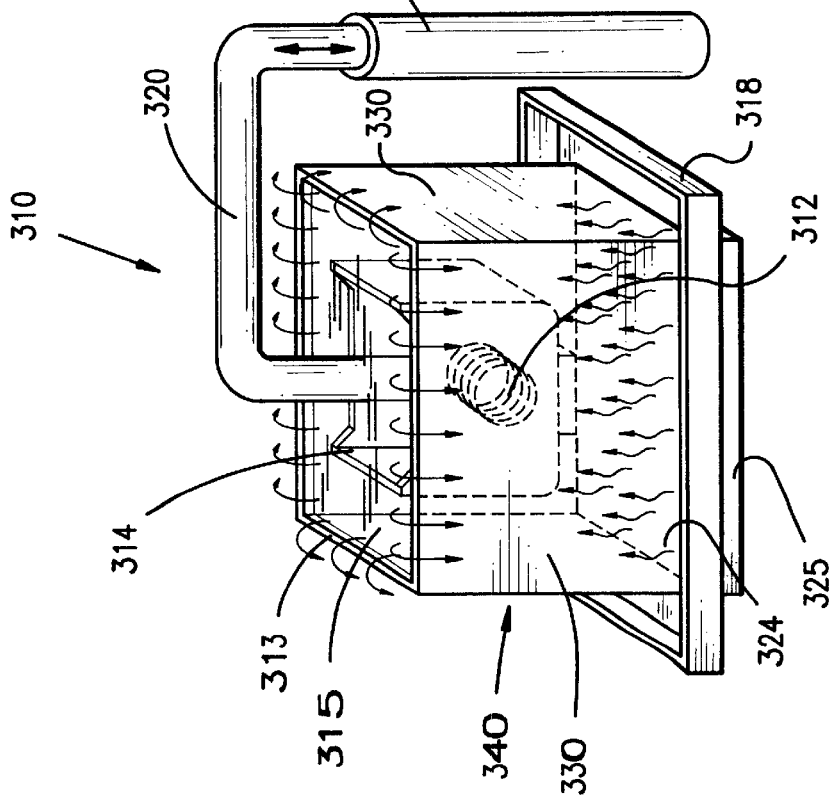
FIG. 11 is a perspective view of an etching bath apparatus of a fourth embodiment of the present invention.

Referring now to FIG. 11, an etching bath apparatus 310 according to a fourth embodiment of the present invention is shown which includes etching solution 315. Wafers 312 are added to the etching bath apparatus 310 in a wafer boat 314. The wafer boat 314 is fixably connected to a moveable arm 320. The moveable arm 320 is mounted on a base 335. The moveable arm 320 may move the wafer boat 314 into or out of the etching tank 340 and may also pivot about the base 335.

The wafers 312 are placed in the wafer boat 314 and the wafer boat 314 is placed into the etching tank 340. The wafers 312 are immersed in the etching solution 315 for a period of time sufficient to effectively etch the wafers 312. During the predetermined period of time that the wafers 312 remain in the etching solution 315, the etching solution is continuously fed from the etching solution flow throughput 325 through baffles 324 and into the etching tank 340. The flow of the etching solution 315 through the baffles 324 is indicated by arrows.

Figure 13:
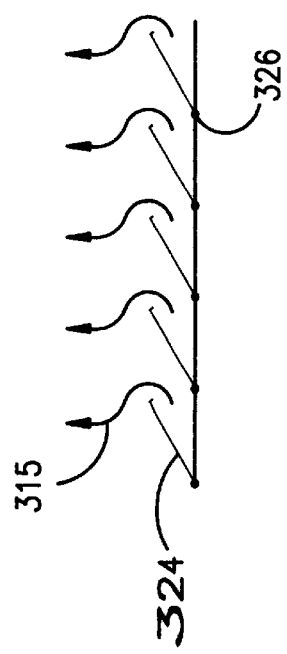
FIG. 13 is a side view of the baffle apparatus of a fourth embodiment of the present invention in an open flow position.
Figure 14:
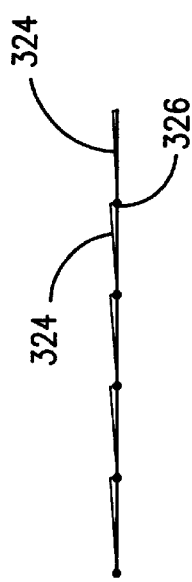
FIG. 14 is a side view of the baffle apparatus of a fourth embodiment of the present invention in a closed flow position.

Reference is made to FIGS. 13 and 14. The baffles 324 are open during etching to allow the etching solution 315 to flow over the wafers 312. To begin the etching process, the baffles pivot about the baffle pivots 326 from a first closed position (FIG. 14) to a second open position (FIG. 13) to allow etching solution 315 to flow into the etching tank 340. Once the process is completed, the baffles 324 are closed and the flow of etching solution 315 into the etching tank 340 is stopped.

As set forth above, the etching solution that flows through the baffles 324 flows to the top of the etching tank 340 as indicated by the arrows and cascades over the edge 313 of the outer walls 330 of the etching tank 340. The etching solution 315 flows down the outer wall 330 and into the outer weir 318, where it is collected.

Figure 12:
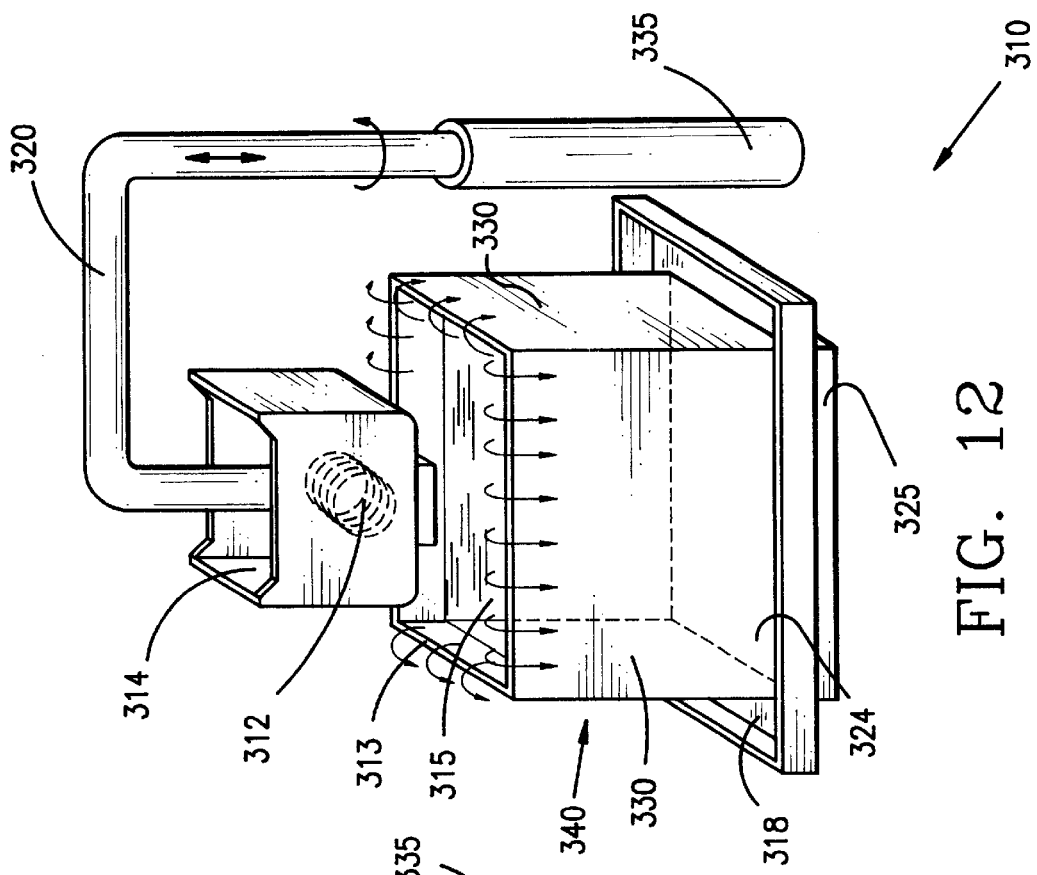
FIG. 12 is a perspective view of an etching bath apparatus of a fourth embodiment of the present invention showing the rapid removal of the etching solution.

Reference is now made to FIG. 12. As the wafers are etched, surface contaminants form on the air/liquid interface of the etching bath tank 340. When the wafers 312 have been in contact with the etching solution 315 for a significant period of time to effectuate the necessary physical characteristics to the wafers 312, the baffles 324 in the bottom of the etching tank 340 are closed. The flow of etching solution to the etching tank 340 is stopped.

Once the baffles 324 are closed, the wafer boat 314 is removed from the etching tank 40 and the etching solution rapidly flows out of the etching bath tank 340. After the wafers 312 have been contacted by the etching solution 315 for a sufficient period of time, the wafer boat 314 is removed from the etching tank 340 by operation of the moveable arm 320. The moveable arm 320 rapidly raises the wafer boat 314 out of the etching tank 340 causing a rapid flow of the etching solution 315. Since the flow rate of the etching solution 315 is significant due to the sudden upward movement of the etching boat 314, the surface tension and eddy current forces holding the contaminants at the air/liquid interface are broken and the contaminants flow into the outer weir 318 where they may be collected.

Figure 15:
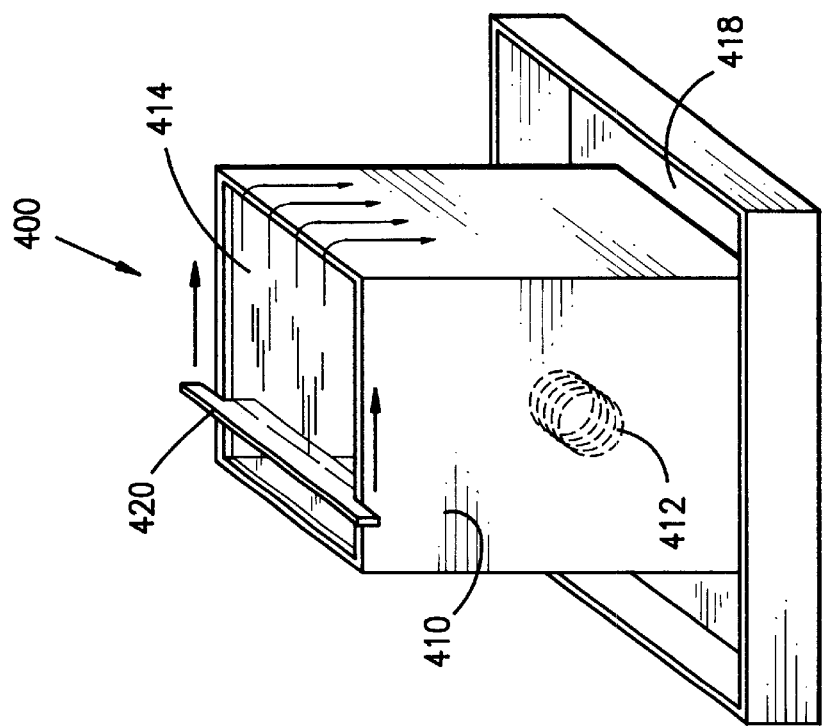
FIG. 15 is a perspective view of an etching bath apparatus of a fifth embodiment of the present invention showing the rapid removal of the etching solution.

Referring now to FIG. 15, an etching bath apparatus 400 is shown which includes an etching solution 414. Wafers 412 are added to the etching bath vessel 410 for etching. According to a fifth embodiment of the present invention, after the wafers 412 have been contacted by the etching solution 414 for a sufficient period of time, a paddle 420 is moved across the top of the etching bath vessel 410 rapidly displacing the etching solution 414 which then flows into the outer weir 418 together with the surface contaminants as indicated by the arrows.

Since the displacement of the etching solution 414 is significant because of the force of the paddle 420, the surface tension and eddy current forces holding the contaminants at the air/liquid interface are broken and the contaminants flow into the outer weir 418 reducing the surface contaminants in the etching vessel.

Semiconductor etching apparatus may generally include from about 5 L to about 150 L of etching solution therein depending upon the particular type of applications in which the etching apparatus is used. The methods and apparatus of the present may remove from about 5% to about 75% of the etching solution from the etching apparatus in order to remove accumulated surface contaminants from the etching solution. For example, in a 350 mm×350 mm×600 mm etching apparatus, about 5 to about 55 liters of the etching solution may be removed from the etching apparatus in order to remove the surface contaminants from the etching solution. In a preferred implementation, enough etching solution remains in the etching apparatus such that the semiconductor wafers remain fully immersed in the etching solution.

The invention is further explained with reference to the following examples. This invention is not intended to be limited by the particular examples described below.

COMPARATIVE EXAMPLE 1

Figure 17:
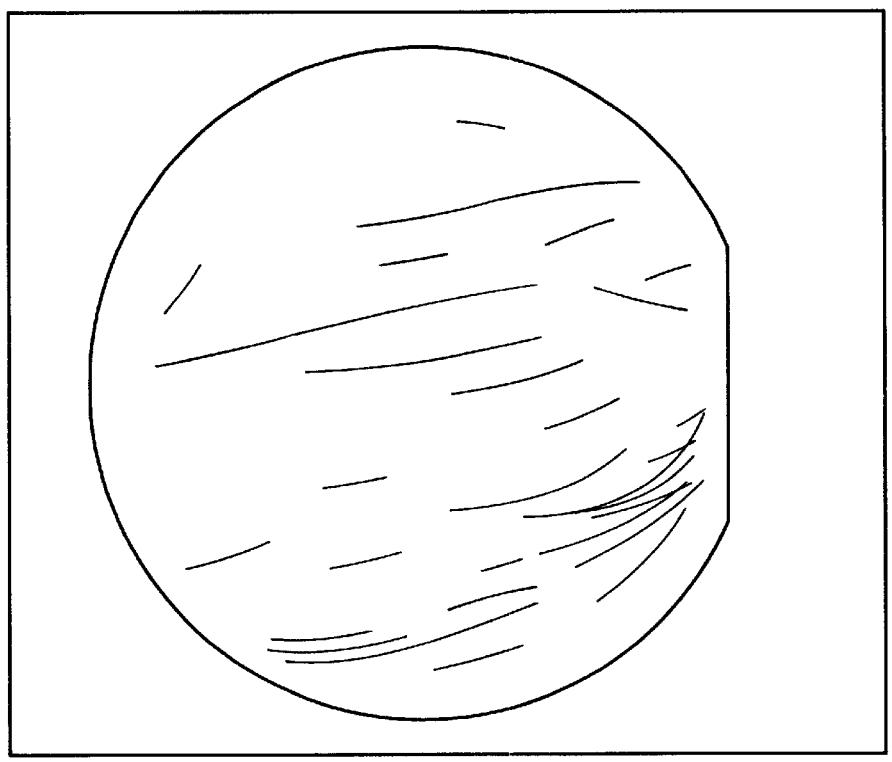
FIG. 17 is a microscopic photograph of a wafer processed according to a conventional method.

Polysilicon wafers were etched in a 21.5° C. aqueous hydrofluoric acid etching solution near the end of the etching bath life. The wafers were etched for 60 seconds. The wafers were then removed from the etching bath. The wafers were examined for surface contamination defects. The wafers showed significant surface defects as can be seen in FIG. 17.

EXAMPLE 1

Figure 16:
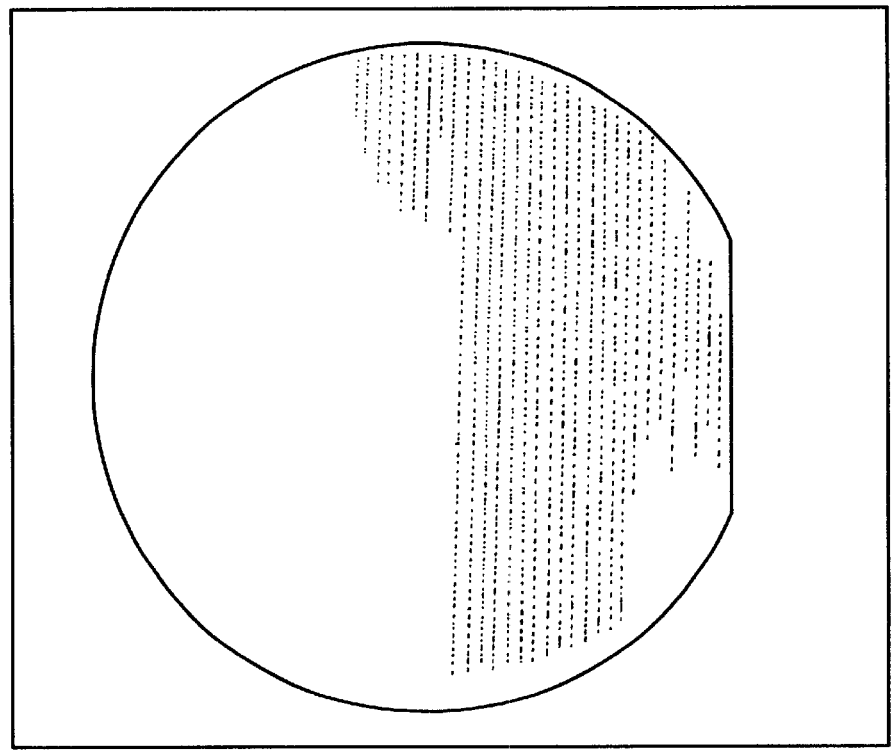
FIG. 16 is a microscopic photograph of a wafer processed according to a method of the present invention.

Polysilicon wafers were etched in a 21.5° C. aqueous hydrofluoric acid etching solution near the end of the etching bath life. The wafers were etched for 60 seconds. The top of the etching bath was rapidly scraped once to remove the surface contaminants. The wafers were then removed from the etching bath. The wafers were examined for surface contamination defects. The wafers showed significantly less surface defects than the wafers processed according to the comparative as can be seen in FIG. 16.

It should again be noted that although the invention has been described with specific reference to the semiconductor etching and cleaning, the invention has broader applicability and may be used in any operation where the removal of contaminants from the air/liquid interface is desired. For example, the surface contamination may be removed from the surface of the etching bath by a scraping method prior to removal of the wafers from the bath. Similarly, the processes described above are only several methods of many that could be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A method for removing surface contaminants from an air/liquid interface of a semiconductor processing bath for processing semiconductor wafers, said method comprising:

immersing wafers in said semiconductor processing bath;

reducing a volume of said semiconductor processing bath contained within a processing apparatus by rapidly removing from a top of said processing apparatus an upper surface portion of a semiconductor processing fluid present in said bath to rapidly reduce said volume of said processing bath contained within said processing apparatus, while said wafers are immersed in said bath, by opening a valve in said processing apparatus to remove said surface contaminants from said air/liquid interface; and removing said wafers from said semiconductor processing bath.

2. A method for reducing contamination on a semiconductor wafer from a wet etching bath comprising:

immersing said semiconductor wafer in said wet etching bath contained in a processing apparatus:

processing said semiconductor wafer in said wet etching bath by continuously feeding an etching fluid;

stopping the continuous feeding of said etching fluid:

subsequently rapidly reducing a volume of said wet etching bath contained within said processing apparatus by removing an upper portion of said etching fluid from said processing apparatus to reduce an overall volume of fluid in said processing apparatus and remove surface contaminants from an air/liquid interface of said wet etching bath while retaining said semiconductor wafer fully immersed in a lower portion of said etching fluid contained within said processing apparatus; and subsequently removing said semiconductor wafer from said wet etching bath, wherein said upper portion of said etching fluid is removed by sliding a door located at an upper portion of said wet etching bath.

3. A method for etching a semiconductor wafer, said method comprising:

placing an etching fluid into a wet etching vessel;

placing said semiconductor wafer in said etching fluid;

contacting said semiconductor wafer with said etching fluid for a predetermined time; and rapidly removing a portion of said etching fluid from the upper surface of said wet etching vessel by sliding a door located at an upper portion of said wet etching vessel.

4. A method for removing surface contaminants from a semiconductor processing bath for processing silicon wafers, said method comprising removing an upper portion of a semiconductor processing fluid present in said bath, while said wafers are in said bath, by sliding a door located at an upper portion of said bath.

5. A method for etching a semiconductor wafer, said method comprising:
   placing an aqueous hydrofluoric acid solution into a wet etching vessel;
   placing said semiconductor wafer in said aqueous hydrofluoric acid solution;
   contacting said semiconductor wafer with said aqueous hydrofluoric acid solution for a predetermined time; and
   removing a portion of said aqueous hydrofluoric acid solution from the upper surface of said wet etching vessel by sliding a door located at an upper portion of said wet etching vessel.

6. A method for removing surface contaminants from an air/liquid interface of a semiconductor processing bath for processing semiconductor wafers, said method comprising:
   immersing said semiconductor wafers in said semiconductor processing bath contained in a processing apparatus;
   reducing a volume of said semiconductor processing bath contained within said processing apparatus by rapidly removing an upper portion of said semiconductor processing bath present in said processing apparatus, while said semiconductor wafers are immersed in a remaining lower portion of said semiconductor processing bath, to permit flow of said upper portion of said processing bath out of said processing apparatus and reduce a total volume of liquid contained within said processing apparatus and thereby break eddy currents holding said surface contaminants at said air/liquid interface, wherein said upper portion of said semiconductor processing bath is removed by opening a valve in said processing apparatus.

7. A method for removing surface contaminants from an air/liquid interface of a semiconductor processing bath for processing semiconductor wafers, said method comprising:
   rapidly removing an upper portion of a semiconductor processing fluid present in said bath by sliding a door located at an upper portion of said bath, while said wafers are in said bath, to permit flow of said upper portion of said processing fluid and thereby break eddy currents holding said surface contaminants at said air/liquid interface.

8. A method for removing surface contaminants from an air/liquid interface of a semiconductor processing bath for processing semiconductor wafers, said method comprising:
   rapidly removing an upper portion of a semiconductor processing fluid present in said bath by sliding a door located at an upper portion of said bath, while said wafers are in said bath, to permit flow of said upper portion of said processing fluid and thereby break surface tension forces holding said surface contaminants at said air/liquid interface.

* * * * *

UNITED STATES PATENT AND TRADEMARK OFFICE
CERTIFICATE OF CORRECTION

PATENT NO. : 6,864,186 B1
DATED : March 8, 2005
INVENTOR(S) : Donald L. Yates

It is certified that error appears in the above-identified patent and that said Letters Patent is hereby corrected as shown below:

Column 7,
Line 27, "present may" should read -- present invention may --.

Column 8,
Line 32, "apparatus:" should read -- apparatus; --.

Signed and Sealed this

Twenty-seventh Day of September, 2005

JON W. DUDAS
*Director of the United States Patent and Trademark Office*